United States Patent [19]
Bischoff et al.

[11] Patent Number: 4,625,228
[45] Date of Patent: Nov. 25, 1986

[54] MULTI-LAYER ELECTRICAL SUPPORT SUBSTRATE

[75] Inventors: Albrecht Bischoff, Bruchköbel-Oberissigheim; Holger Eisentraut, Langenselbold; Joachim Schmidt, Usingen, all of Fed. Rep. of Germany

[73] Assignee: W.C. Heraeus GmbH, Hanau, Fed. Rep. of Germany

[21] Appl. No.: 661,934

[22] Filed: Oct. 17, 1984

[30] Foreign Application Priority Data

Nov. 30, 1983 [DE] Fed. Rep. of Germany ....... 3343251

[51] Int. Cl.⁴ ............................................. H01L 23/48
[52] U.S. Cl. ......................................... 357/70; 357/71; 357/67; 357/68; 357/65
[58] Field of Search ............ 357/71, 67, 70, 68, 357/65, 71 S, 67 R, 67 S

[56] References Cited

U.S. PATENT DOCUMENTS

| | | | |
|---|---|---|---|
| 3,252,722 | 5/1966 | Allen | 357/67 X |
| 3,551,997 | 1/1971 | Etter | 357/67 X |
| 3,576,415 | 4/1971 | Gwyn, Jr. | 357/67 X |
| 4,000,842 | 1/1977 | Burns | 357/71 X |
| 4,151,545 | 4/1979 | Schnepf et al. | 357/71 |

FOREIGN PATENT DOCUMENTS

| | | | |
|---|---|---|---|
| 3106193 | 9/1982 | Fed. Rep. of Germany | 357/70 |
| 5420681 | 2/1979 | Japan | 357/715 |

OTHER PUBLICATIONS d'Heurle et al, *IBM Tech. Discl. Bull.*, vol. 19, No. 8, Jan. 1977, p. 3233.

*Primary Examiner*—Martin H. Edlow
*Assistant Examiner*—William Mintel
*Attorney, Agent, or Firm*—Frishauf, Holtz, Goodman & Woodward

[57] ABSTRACT

To prevent defoliation or splitting-off of an aluminum or aluminum alloy which is roll-plated on a copper or copper alloy base, an intermediate nickel layer having less than 0.05% contaminants is applied beneath the aluminum layer. If the base is a copper alloy, an intermediate copper layer which is of an oxygen-free copper or copper alloy is placed between the base and the nickel layer. Typical dimensions are: base copper layer (1, 13): 0.25 mm; oxygen-free copper layer (7, 15): 0.005 to 0.01 mm; nickel layer with less than 0.05% contaminants or impurities: about 0.01 mm; AlSi 0.5 aluminum alloy: 0.005 to 0.006 mm.

14 Claims, 6 Drawing Figures

MULTI-LAYER ELECTRICAL SUPPORT SUBSTRATE

The present invention relates to a substrate or support carrier, particularly for electrical components such as semiconductor elements, semiconductor chips, or the like, which is made of copper or a copper alloy and on which the electrical element is applied; aluminum or an aluminum alloy is applied to the copper or copper alloy substrate by roll-on plating.

BACKGROUND

Support substrates or carriers for semiconductor elements of the type to which the present invention relates are described, for example, in German Patent Disclosure Document DE-OS No. 31 06 193. These support elements are made of compound material. In the roll-plating process it is necessary to carry out intermediate or recrystallization annealing. The directly contacting copper-containing layers and aluminum-containing layers, during such treatment, will form intermetallic phases. Upon bending of the resulting structure, the layers tend to show brittleness; adhesion of the layers is impaired and they may separate from each other. Upon punching such substrates, separation or defoliation effects can be observed at the cut edges which occur during the punching, stamping or other cutting operations.

THE INVENTION

It is an object to improve support substrate materials, to form improved substrate carriers for electrical components, particularly for semiconductor elements and chips, in which copper or copper alloy bases are plated with an aluminum or aluminum alloy layer, and in which the respective layers have excellent adhesion, and brittleness at the interface, or of the layers themselves, is effectively avoided.

Briefly, the support substrate has a base of copper or a copper alloy, and then an intermediate layer of nickel, in which the nickel has less than 0.05% contaminants, is provided before an aluminum or aluminum alloy is applied, by roll-on plating.

The intermediate layer of nickel, of high purity, so that it will contain less than 0.05% contaminants, has the advantage that the layers will adhere well, and excellent adhesion and flowing-on of the layer, upon roll-on plating, is insured.

If the base is made of a copper alloy, it has been found desirable to include a further intermediate layer between the nickel layer and the copper alloy, of copper which does not include oxygen. The thickness of the intermediate copper layer may be between about 5% to 50% of that of the sum of the layers of copper, nickel, and the aluminum or aluminum alloy layer.

In a preferred form, the base copper is a CuFe2 alloy. For the aluminum alloy, AlSi containing 0.5 to 1% silicon is suitable.

The thickness of the base is about 0.2 to 0.9 mm, said nickel layer has a thickness of about 0.002 to 0.03 mm, and the plating layer has a thickness of about 0.004 to 0.015 mm.

The substrate layers can be readily punched or bent, without separation of the respective layers, or separation of the connecting bond. Defoliation, therefore, has been eliminated. To the extent that intermetallic phases result, they will occur at temperatures at least 100° C. higher than those of the prior art structure, which included only copper or copper alloy paired with aluminum or aluminum alloy.

DRAWINGS

DETAILED DESCRIPTION

Figure 1:
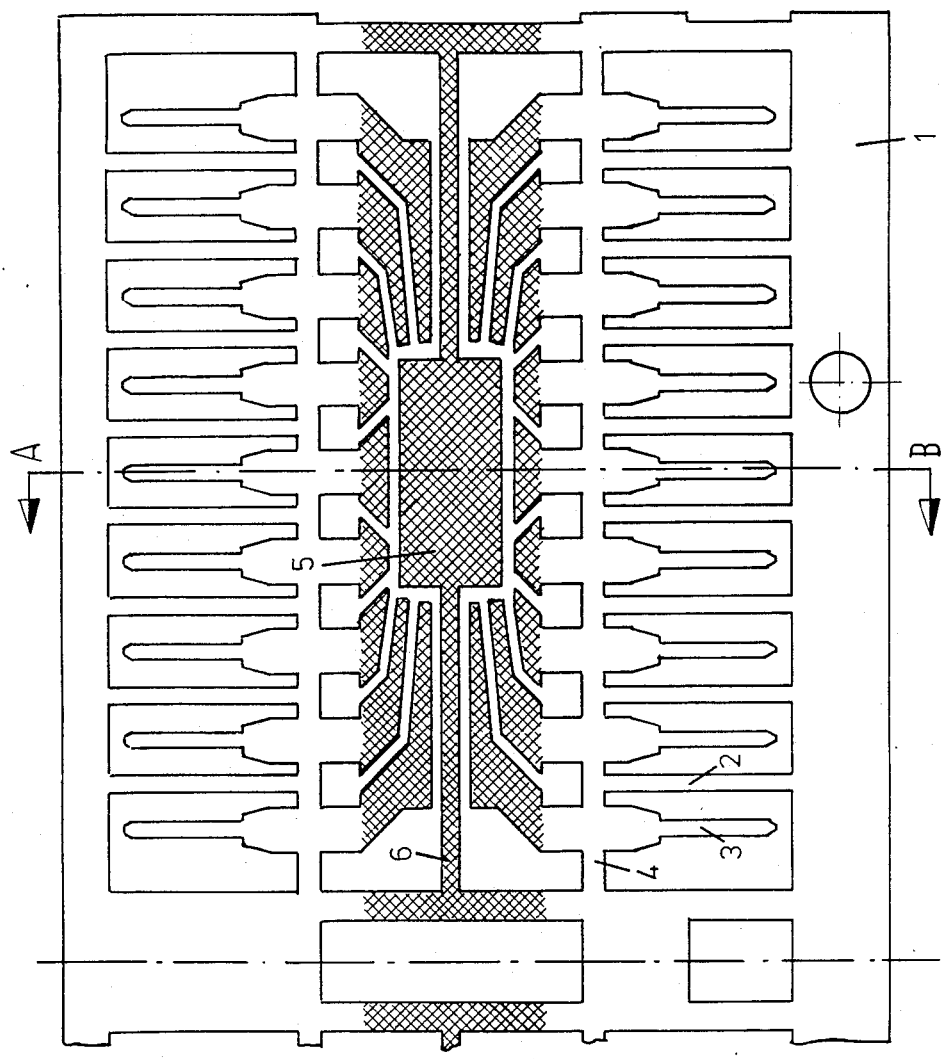
FIG. 1 is a top view of a support substrate for a semiconductor chip.
Figure 2:
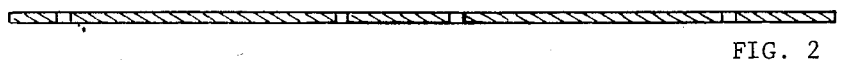
FIG. 2 is a vertical section along lines A–B.
Figure 2A:
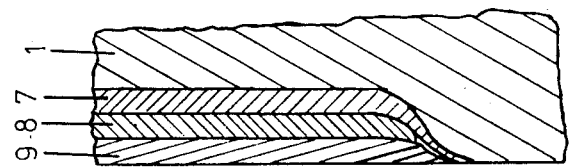
FIG. 2a is a highly enlarged fragmentary portion of the cross section of FIG. 2.

The support substrate of FIG. 1 is made of a CuFe2 alloy. It has an outer frame 1 which is connected by strips 2 with fingers 3. The fingers 3 are interconnected by connection strips 4. The fingers 3 extend close to an island 5 on which a semiconductor chip, such as an integrated circuit (IC), is secured. The island 5 is connected with the frame 1 by connecting strips 6. The region of the support substrate which is shown cross-hatched is made in accordance with the present invention, as best seen in FIG. 2.

The system carrier which, in the present example, is made of a CuFe2 alloy, has, in the region where the system carrier is to be located, a copper layer 7 applied thereon. The copper layer 7 has a thickness of about 0.005 mm. The copper layer is free from oxygen. A nickel layer 8 is applied over the copper layer 7. The nickel layer 8 has less than 0.05% impurities The final or top layer is a layer 9 of aluminum or aluminum alloy. In the present example, the layer 9 is made of AlSi 0.5. The thickness of the nickel layer 8 is about 0.01 mm; the aluminum alloy layer 9 has a thickness of about 0.006 mm. The thickness of the base substrate 2 is about 0.25 mm.

Figure 3:
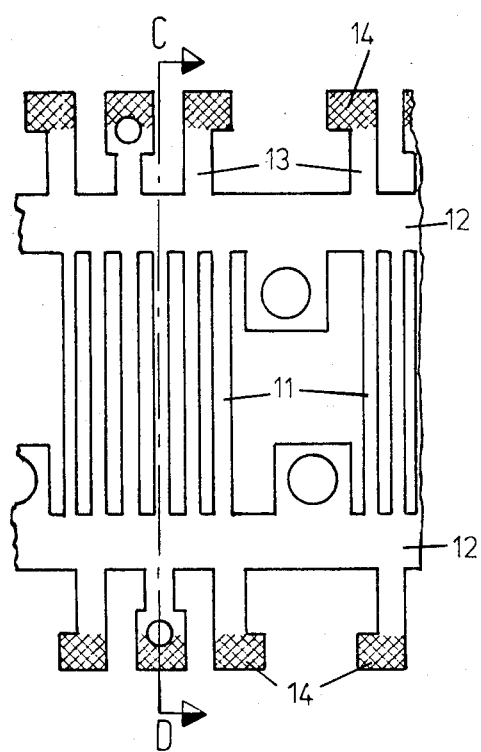
FIG. 3 is a top view of a support substrate for a semiconductor element, in which the semiconductor element is placed on an island located at a marginal or rim portion of the substrate.

FIG. 3 illustrates another arrangement, in which the actual carrier region for the electrical component or semiconductor is at the marginal portion of the overall structure. The support has two parallel strips 11 which are connected by connecting strips 12. Fingers 13 extend outwardly from the connecting strips 12 and define two facing pad or island portions 14, on which the semiconductor element is arranged.

Figure 4:
FIG. 4 is a longitudinal sectional view along lines C–D of FIG. 3.
Figure 4A:
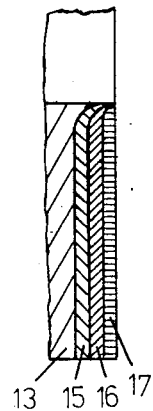
FIG. 4a is a highly enlarged fragmentary view of a portion of the section of FIG. 4.

The strips 11, 12 and fingers 13, as well as the island 14, are made of a CuFe2 alloy. The fingers 13, as well as the island 14, are layer structures in the region of the outer ends, as best seen in FIGS. 4 and 4a.

A copper layer 15, in which the copper is free from oxygen, is applied on the CuFe2 alloy base; on the copper layer 15 a nickel layer 16 is applied, and thereover a layer 17 of AlSi 0.5 alloy. The thicknesses of the respective layers in the examples of FIGS. 3 and 4 are as follows:

CuFe2 support substrate 11, 12, 13: 0.25 mm
oxygen-free copper layer 15: 0.01 mm
nickel layer 16: 0.01 mm
AlSi 0.5 layer 17: 0.005 mm.

We claim:

1. A multi-layer support substrate for an electrical component, particularly for semiconductor elements or chips, said substrate having, at least in the region of support for said component, a base portion made of copper or copper alloy, and a plating layer pattern of aluminum or aluminum alloy, applied to the base portion by roll-on plating, said plating layer pattern supporting said electrical component, and comprising, in accordance with the invention, a layer of nickel having less than 0.05% impurities, or contaminants, located between the base portion and the rolled-on plating layer.

2. Support substrate according to claim 1, in which the base portion comprises a copper alloy;

and wherein, in accordance with the invention; a layer of oxygen-free copper is positioned between the layer of nickel and said base portion comprising copper alloy.

3. Support substrate according to claim 2, wherein the thickness of the oxygen-free copper intermediate layer is between 5 to 50% of the sum of the thicknesses of the layers forming: the base; the nickel layer, and the plating layer.

4. Support substrate according to claim 1, wherein the base portion comprises CuFe2.

5. Support substrate according to claim 2, wherein the base portion comprises CuFe2.

6. Support substrate according to claim 3, wherein the base portion comprises CuFe2.

7. Support substrate according to claim 1, wherein the plating layer comprises AlSi containing 0.5 to 1% silicon.

8. Support substrate according to claim 2, wherein the plating layer comprises AlSi containing 0.5 to 1% silicon.

9. Support substrate according to claim 3, wherein the plating layer comprises AlSi containing 0.5 to 1% silicon.

10. Support substrate according to claim 4, wherein the plating layer comprises AlSi containing 0.5 to 1% silicon.

11. Support substrate according to claim 5, wherein the plating layer comprises AlSi containing 0.5 to 1% silicon.

12. Support substrate according to claim 6, wherein the plating layer comprises AlSi containing 0.5 to 1% silicon.

13. Support substrate according to claim 1, wherein the base portion has a thickness of about 0.2 to 0.9 mm; said nickel layer has a thickness of about 0.002 to 0.03 mm; and the plating layer has a thickness in the order of about 0.004 to 0.015 mm.

14. Support substrate according to claim 13, in which the base portion comprises a copper alloy;

wherein, in accordance with the invention, a layer of oxygen-free copper is positioned between the layer of nickel and said base portion comprising copper alloy;

and wherein said oxygen-free intermediate copper layer has a thickness between about 0.005 to 0.01 mm.

* * * * *